United States Patent [19]

Portmann

[11] 4,291,266
[45] Sep. 22, 1981

[54] DEVICE FOR CHARGING AN ACCUMULATOR FROM AN ELECTRICAL ENERGY SOURCE MORE PARTICULARLY FOR AN ELECTRONIC WATCH

[75] Inventor: Hubert Portmann, Colombier, Switzerland

[73] Assignee: Ebauches SA, Neuchatel, Switzerland

[21] Appl. No.: 36,984

[22] Filed: May 8, 1979

[30] Foreign Application Priority Data

May 8, 1978 [CH] Switzerland .................. 4957/78

[51] Int. Cl.³ .................. H02J 7/10; G04C 3/00
[52] U.S. Cl. .................. 320/2; 320/40; 320/21; 323/906; 368/205
[58] Field of Search .................. 320/2, 21, 22, 61, 39, 320/40; 323/15, 8, 22 R; 368/205

[56] References Cited

U.S. PATENT DOCUMENTS

| | | | |
|---|---|---|---|
| 3,222,535 | 12/1965 | Engelhardt | 320/22 X |
| 3,802,178 | 4/1974 | Tsuruishi . | |
| 4,134,057 | 1/1979 | Portmann | 323/15 X |
| 4,183,082 | 1/1980 | Ishii | 323/20 X |

FOREIGN PATENT DOCUMENTS 1510040 5/1978 United Kingdom .

*Primary Examiner*—Robert J. Hickey
*Attorney, Agent, or Firm*—Wender, Murase & White

[57] ABSTRACT

The invention relates to an electronic device for charging an accumulator from an electric energy source, more particularly one or more solar cells, intended in particular for an electronic wristwatch. The device represents the equivalent of an ideal diode inserted between the source of electrical energy and the battery.

A solar cell (1) feeds a charging current to the accumulator (2) via a transistor (3) and, if desired, a diode (7) in parallel with the transistor (3). The conduction state of the transistor (3) is monitored by a differential amplifier (4) which has an off-set voltage ($U_{off}$), the value and polarity of which are determined by a generator (5). This off-set voltage ($U_{off}$) defines the voltage drop between the energy source and the accumulator (2) which is selected to be between 20 and 50 millivolts.

5 Claims, 5 Drawing Figures

DEVICE FOR CHARGING AN ACCUMULATOR FROM AN ELECTRICAL ENERGY SOURCE MORE PARTICULARLY FOR AN ELECTRONIC WATCH

BACKGROUND OF THE INVENTION

The present invention relates to an electronic device for charging an accumulator from an electrical energy source. The invention is more particularly useful in an electronic wristwatch.

Such devices are known, particularly from U.S. Pat. No. 3,802,178 which describes a device for charging an accumulator by a photo-electric cell or any other electric energy source through a diode. The diode is used to prevent the accumulator from discharging into the photo-electric cell if the cell cannot produce a voltage sufficient to charge the accumulator, for example in the event of insufficient illumination.

The disadvantage of this device is that the energy source has to overcome a voltage of approximately 0.5 volt (threshold voltage of the diode). As a result, a substantial amount of energy is lost. Such a waste should be avoided in the case of an electronic watch, as it considerably reduces the battery lifetime.

U.S. Pat. No. 3,731,474 also discloses a device limiting the voltage produced by a solar cell charging an accumulator. This device comprises a bipolar NPN transistor, the emitter and collector of which are respectively connected to the positive and negative poles of the solar cell, and the control electrode to the positive pole of the accumulator. A diode is inserted between the positive poles of the solar cell and the accumulator. When the illumination of the cell becomes strong, the current circulating in the diode produces a voltage drop both across the terminals thereof and at the input of the transistor. Such a drop is sufficient to render the transistor conductive and thus shunt a non negligible amount of current towards the negative pole of the cell.

The disadvantage of this device is that a large amount of energy is lost in the transistor as well as in the diode.

German Patent application (DOS) No. 25 34 455 also describes a device for charging an accumulator from a battery. A transistor is connected between the battery and the accumulator. An electronic circuit controls the conduction of the transistor, which is directly proportional to the voltage drop between the battery and the accumulator. This conduction is adjusted so as to be just sufficient for the consumption of an electronic circuit connected to the terminals of the accumulator.

The disadvantage of this device is that the energy delivered by the battery is not fully utilised for charging the accumulator, because this energy is partly lost in the transistor for limiting the conduction thereof. Moreover, if the voltage drop between the battery and the accumulator is less than a given threshold (which is not negligible), the transistor remains blocked.

SUMMARY OF THE INVENTION

The object of the present invention is to overcome these disadvantages by providing a means having the characteristics of an ideal diode, that is to say, a diode which conducts in the forward direction with a negligible drop in voltage, whilst in the reverse direction it blocks current as in a normal diode.

BRIEF DECRIPTION OF THE DRAWINGS

The present invention will be described further, by way of example, with reference to the accompanying drawings, in which.

DESCRIPTION OF THE PREFERRED EMBODIMENTS

Figure 1:
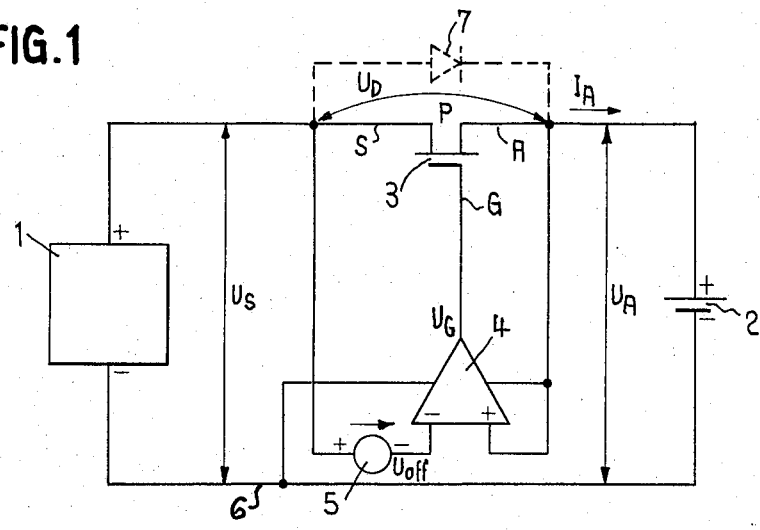
FIG. 1 shows an example of an application of the device according to the invention with the negative poles of the source and the accumulator as common potential.

FIG. 1 is the diagram of a charging circuit according to the present invention, including an electric energy source, in this case, a solar cell 1, connected to an accumulator 2 through an enhancement mode P channel MOSFET transistor 3. The transistor 3 is provided with two main electrodes S and A and with a control electrode G. The first and the second main electrodes S and A are respectively connected to positive poles of the solar cell 1 and of the accumulator 2, whereas the control electrode G is connected to the output of a differential amplifier 4. The amplifier 4 is provided with a non-inverting input connected to the positive pole of the accumulator 2 and an inverting input connected, through an off-set voltage $U_{off}$ generator 5, to the positive pole of the cell 1. It is obvious that this generator can also be included in the amplifier 4. The negative poles of the solar cell 1 and the accumulator 2 are connected together by a line 6. Feeding of the amplifier 4 is ensured by the accumulator 2.

The operation of this circuit will be described hereinafter with reference to FIG. 2 which is a diagram illustrating the voltages measured in different points of the circuit of FIG. 1 as a function of the difference $U_D = U_2 - U_A$ between the voltage $U_S$ on the terminals of the solar cell 1 and the voltage $U_A$ on the terminals of the accumulator 2, and with reference to FIG. 3, which is a diagram of the charging current $I_A$ for charging the battery as a function of the voltage $U_D$. The curves in dotted lines correspond to an imaginary case in which the off-set voltage $U_{off}$ is zero and those in full lines to the actual case in which the voltage $U_{off}$ is different from zero. In order to simplify the explanation, it is assumed that the voltage $U_A$ remains constant whatever the variations of the voltage $U_S$ may be. It may be recalled that what is referred to as the off-set voltage of a differential amplifier is the voltage which must be applied between its inputs to obtain an output voltage equal to zero.

The imaginary case in which the off-set voltage $U_{off}$ is zero will be described first.

For weak to very weak illuminations of the solar cell 1, the voltage $U_S$ produced by this cell is less than the voltage $U_A$ produced by the battery 2. Consequently, the differential voltage $U_D$ applied to the inputs of the amplifier 4 is negative ($U_D<0$ zone), i.e. the voltage $U_A$ at the non-inverting input is more positive than the voltage $U_S$ at the inverting input. A positive voltage $U_G$, almost equal to the voltage $U_A$, in thus present at the output of the amplifier. This voltage $U_G$ is supplied to the control electrode G of the transistor 3, thus blocking said transistor due to the fact that the voltage difference $U_A-U_G$ between the control electrode G and the most positive main electrode, i.e. the electrode (A) connected with the accumulator 2, has a value less than the threshold conducting voltage $U_{threshold}$ of the transistor 3. The connection between the accumulator 2 and the solar cell 1 is therefore interrupted and there is no need to fear any discharge of the accumulator 2 into the solar cell 1.

When the illumination of the solar cell 1 is strong, the voltage $U_S$ is greater than the voltage $U_A$ ($U_D>0$ zone) and the polarity of the differential voltage $U_D$ at the inputs of the amplifier 4 is reversed with respect to the preceding example and the output voltage $U_G$ decreases until approximately reaching the potential of the common line 6. At the same time, the most positive main electrode (S) now becomes the source of the transistor 3 and, since the voltage difference $U_S-U_G$ is positive, the transistor 3 becomes conductive and a current $I_A$ is established which now goes from the solar cell 1 to the accumulator 2, thus charging the accumulator 2. The voltage drop $U_D$ across the transistor 3 depends, in the straight portion of the curve $U_S-U_G$, on the output characteristic of the amplifier 4.

For very strong illuminations, the characteristic $U_S-U_G$ is curved, that is to say, the transistor 3 enters its saturation zone. Consequently the voltage $U_D$ rapidly increases. This increase depends on the geometrical dimensions of the channel of the transistor 3. A transistor having a large channel cross-section is therefore necessary for very strong illuminations. Such a transistor, however, is expensive to manufacture.

The above problem is overcome in the present invention by the use of a diode 7 (shown in dotted lines in FIG. 1) which is connected in parallel with the transistor 3 so that its anode and its cathode are connected respectively to the positive poles of the solar cell 1 and the accumulator 2. It is thus possible to allocate a reasonable surface area on an integrated circuit for the transistor 3 without excessively limiting the current used to charge the accumulator 2. The distribution of currents circulating in the transistor 3 and in the diode 7 will be explained hereinafter with reference to FIG. 4. It must be mentioned that the transistor 3 is selected to ensure a slight voltage drop $U_D$ up to a medium illumination. For increasingly strong illuminations, the transistor begins to saturate, so that when the voltage $U_D$ reaches approximately 0.5 V, the diode 7 begins to allow a non-negligible current to flow and that, the proportion between the current in the diode 7 and the current in the transistor 3 increases exponentially with an increase of the illumination. In this manner, the drop in voltage $U_D$ is limited to approximately 0.5 V. This energy loss is acceptable, for it takes place only with very strong illuminations of the solar cell 1.

When the illumination increases from a low value, the voltage $U_S$ increases and the voltage $U_D$ becomes less negative. For a certain value of the illumination, the voltage $U_A-U_G$ becomes higher than the voltage $U_{threshold}$ (point B) and a current $I_A$ is established, whereas $U_S$ is still less than $U_A$. This current is therefore negative. i.e., it circulates from the accumulator 2 to the solar cell 1 (see discharge zone of FIG. 3) and thus discharges the accumulator 2. When $U_D=0$, the current $I_A$ drops to zero. When $U_D$ becomes positive, the current $I_A$ begins to charge the accumulator 2.

The above-mentioned discharge is avoided by adjusting, with the help of the voltage generator 5, both the value and polarity of the off-set of the amplifier 4 in such a way that the transistor 3 is never in its conductive state when $U_S$ is lower than $U_A$.

The off-set of the differential amplifier can also be adjusted by approximately selecting the width of the channels of the transistors of the input stage of the amplifier, or adjusting the symmetry of the currents passing through the channel of each transistor, or both.

Figure 2:
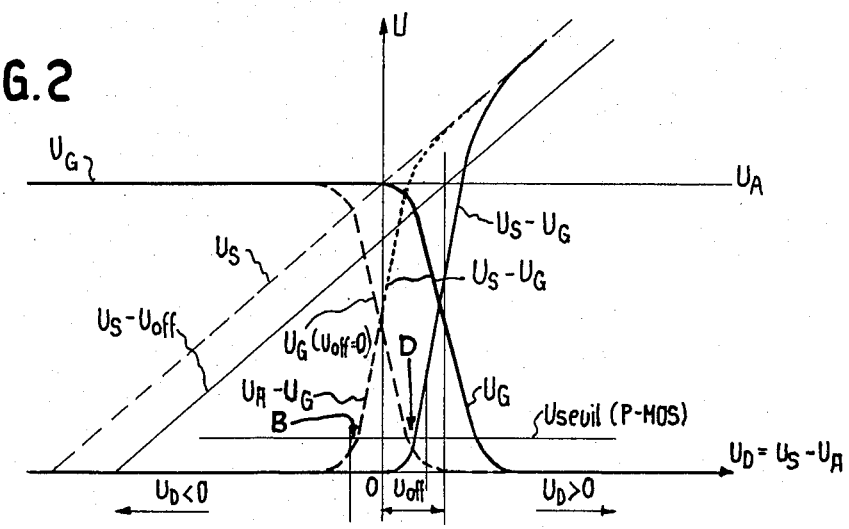
FIG. 2 is a diagram showing voltages at different points in the circuit of FIG. 1.
Figure 3:
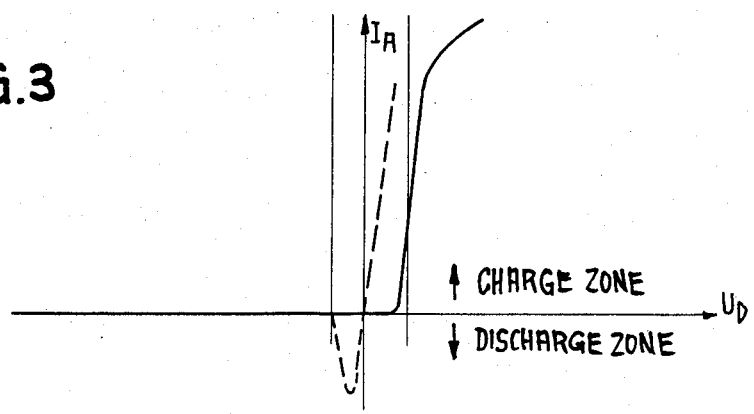
FIG. 3 is also a diagram, useful for understanding FIG. 1, showing the charging current of the accumulator as a function of the voltage between the cell and the accumulator.

The desired off-set voltage, for example 20 to 50 millivolts, is in a direction such that the curves in full lines of FIGS. 2 and 3 are displaced in the positive direction (to the right) of the co-ordinates $U_D$, relative to the curves in dotted lines which show the operation of the device when $U_{off}$ is zero. The result is that the curve $U_S-U_G$ (FIG. 2) reaches the voltage $U_{threshold}$ for a value of $U_D$ equal to approximately $\frac{1}{2} U_{off}$ (point D), thus ensuring that, on the one hand, the current $I_A$ (FIG. 3) never circulates from the accumulator 2 to the solar cell 1 and, on the other hand, the medium voltage drop $U_D$ does not exceed the voltage $U_{off}$ in the linear portion of the operation of the transistor 3. This means that, for medium illuminations of the solar cell 1, the voltage drop $U_D$ is more than ten times less than that which would be obtained if the device according to the present invention was replaced by a normal diode.

Figure 4:
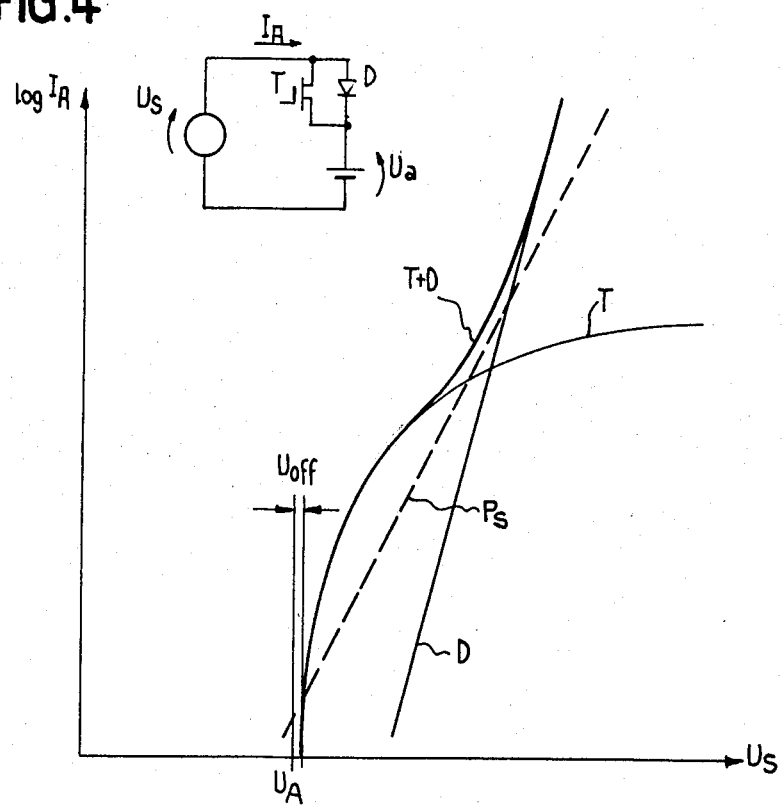
FIG. 4 is of assistance in the general understanding of the operation of the device according to the invention and illustrates how the charging current varies according to the voltage supplied by the cell for different curcuit configurations.
Figure 5:
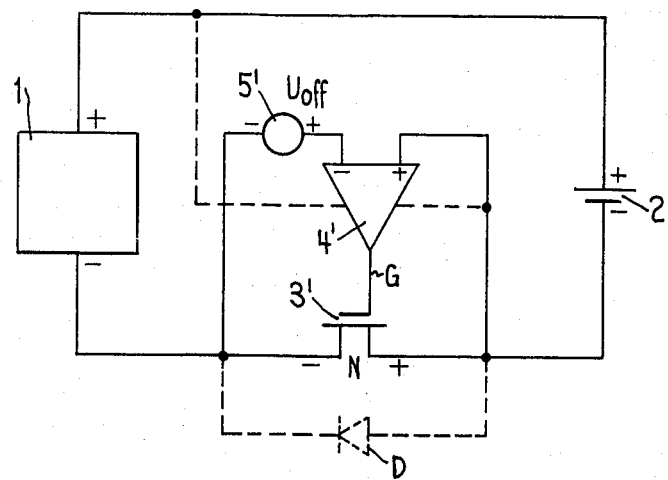
FIG. 5 shows a second embodiment of the device according to the invention with the positive poles of the source and the accumulator as common potential.

FIG. 4 is a diagram of the logarithm of the charging current $I_A$ of the accumulator 2 as a function of the voltage $U_S$ on the terminals of the solar cell 1. Shown in full lines, on the one hand, is the charging characteristic D of the battery through a diode, which is a straight line and, on the other hand, the charging characteristic T (curve) through the transistor 3. The resulting charging characteristic through the transistor 3 disposed in parallel with the diode 7 is the curve T+D shown in heavy line. It will be seen that for low values of $I_A$, i.e., with medium illuminations, the presence of the diode 7 has practically no influence on the voltage drop across the transistor 3 (the two curves T and T+D are therefore merged). When the illumination increases, the current curve $I_A$ separates more and more from the curve T to progressively merge with the straight line D. In other words, in the range of illuminations producing a charging of the accumulator 2, the voltage drop on the terminals of the device according to the invention, i.e. $U_S-U_A$, passes from the value of approximately the off-set voltage, for medium illuminations, to a value corresponding to the voltage drop on a normal diode, for strong illuminations.

FIG. 4 also shows a straight dotted line $P_S$ which represents the optimal charging characteristic of the solar cell 1, i.e., the geometrical locus of maximum power available for each illumination value.

The solar cell 1 may be replaced by a plurality of cells capable of being disposed in parallel or in series according to the incident illumination by any known electronic device which will therefore not be described here, in order to adapt in an optimum manner the voltage provided by the cells with the voltage of the battery. Furthermore, any source converting incident variable energy of any nature into electrical energy may be connected advantageously to the device of the present invention.

It is obvious that the device according to the present invention may be designed so that the line of common potential is connected to the positive terminals of the solar cell and of the accumulator. FIG. 3 shows such an embodiment similar to that of FIG. 1 in which the negative pole of the solar cell 1 is connected to the negative pole of the accumulator 2, by means of an N channel MOSFET transistor 3', which is controlled by a differential amplifier 4'. The positive poles of the solar cell 1 and of the accumulator 2 are directly connected together and form a common line. The amplifier 4' must be designed so that it can work with output voltages very close to the negative feed potential. Such a circuit may be, for example, the operational amplifier in an integrated circuit type LM324 of the National Semiconductor Corp. The off-set voltage generator 5' is also shown. This generator 5' is in reality included in the amplifier 4' and may be achieved on the same principle as that described for the diagram in FIG. 1. A diode D may also be added for achieving the same object as in the case of FIG. 1.

I claim:

1. An electronic device for the charging of an accumulator from a source of electrical energy, for use, more particularly, in an electronic watch, said accumulator and said energy source each having a first and a second pole, said second poles being connected together, comprising conducting means having a control electrode and two main electrodes connected respectively to said first poles of the energy source and the accumulator; a differential amplifier having two inputs respectively coupled to said main electrodes and an output connected to said control electrode, said amplifier responding to the potential difference between the first poles of said energy source and said accumulator for controlling the conduction of said conducting means; and means for adjusting the off-set voltage of said differential amplifier at a predetermined value and polarity, in order to render negligible the voltage drop in said conducting means and to avoid the discharge of said accumulator into said energy source.

2. An electronic device according to claim 1, wherein said first poles are the positive poles of said energy source and said accumulator and said conduction means is a P channel MOSFET transistor.

3. An electronic device according to claim 1, wherein said first poles are the negative poles of said energy source and said accumulator and said conducting means is an N channel MOSFET transistor.

4. An electronic device according to claim 1, wherein a diode is connected between the first poles of said energy source and said accumulator.

5. An electronic device according to claim 1, wherein said energy source comprises at least one photo-electric cell.

* * * * *